United States Patent [19]
Yuan et al.

[11] Patent Number: 5,231,037
[45] Date of Patent: Jul. 27, 1993

[54] METHOD OF MAKING A POWER VFET DEVICE USING A P+ CARBON DOPED GATE LAYER

[75] Inventors: Han-Tzong Yuan; Tae Seung Kim, all of Dallas; Francis J. Morris, Plano, all of Tex.

[73] Assignee: Texas Instruments Incorporated, Dallas, Tex.

[21] Appl. No.: 876,252

[22] Filed: Apr. 30, 1992

[51] Int. Cl.$^5$ ............................................. H01L 21/44
[52] U.S. Cl. ...................................... 437/40; 437/176; 437/179; 148/DIG. 40
[58] Field of Search ............. 437/6, 24, 39, 40, 41, 437/176, 179, 184, 911, 959; 148/DIG. 40, DIG. 56, DIG. 140, DIG. 126

[56] References Cited

U.S. PATENT DOCUMENTS

| | | | |
|---|---|---|---|
| 4,129,879 | 12/1978 | Tantraporn et al. | 357/23.4 |
| 4,632,710 | 12/1986 | Van Rees | 148/DIG. 40 |
| 5,045,502 | 9/1991 | Lau et al. | 437/184 |
| 5,077,231 | 12/1991 | Plumton et al. | 437/133 |
| 5,116,455 | 5/1992 | Daly | 437/96 |

FOREIGN PATENT DOCUMENTS

| | | | |
|---|---|---|---|
| 0232122 | 10/1987 | Japan | 437/959 |

OTHER PUBLICATIONS

P. M. Campbell et al., "150 Volt Vertical Channel GaAs FET", *IEDM*, pp. 258–260, 1982.

P. M. Campbell et al., "Trapezoidal-Groove Schottky-Gate Vertical-Channel GaAs FET (GaAs Static Induction Transistor)", *IEEE Electron Device Letters*, pp. 304–306, vol. EDL-6, No. 6, Jun. 1985.

Mutsu052307154 hiro Mori, et al., "A High Voltage GaAs Power Static Induction Transistor", *Extended Abstracts of the 19th Conference on Solid State Devices and Materials*, pp. 279–282, Tokyo, 1987.

Wiliam R. Frensley, et al., "Design and Fabrication of a GaAs Vertical MESFET", *IEEE Transactions on Electron Devices*, pp. 952–956, vol. ED-32, No. 5, May 1985.

*Primary Examiner*—Brian E. Hearn
*Assistant Examiner*—C. Chaudhari
*Attorney, Agent, or Firm*—Dana L. Burton; James C. Kesterson; Richard L. Donaldson

[57] ABSTRACT

This is a method of forming a vertical transistor device. The method comprises: forming a n-type source layer 12; forming a p+ carbon doped gate layer 14; forming a gate structure from the gate layer; and forming a n-type drain layer 16 over the gate structure to provide a buried carbon doped gate structure. The buried carbon doped gate structure provides a very small device with favorable on-resistance, junction capacitance, gate resistance, and gate driving voltage. Other devices and methods are also disclosed.

14 Claims, 1 Drawing Sheet

METHOD OF MAKING A POWER VFET DEVICE USING A P+ CARBON DOPED GATE LAYER

This invention was made with Government support under contract N660019-91-C-6008 awarded by the Department of the Navy. The Government has certain rights in this invention.

FIELD OF THE INVENTION

This invention generally relates to power FET devices.

BACKGROUND OF THE INVENTION

Without limiting the scope of the invention, its background is described in connection with power FET devices, as an example.

Heretofore, in this field, as VHSIC electronics emerged, it became obvious that power distribution practices and power supply technology were not adequate to supply well regulated power to using circuitry. The concept of centralized power with decoupled loads simply has not worked well. As we move into the GaAs era, the power distribution problem moves from standard design techniques to real point-of-use regulators.

GaAs VFETs are attractive for high-efficiency switching power supplies. Several studies have concluded that the intrinsic devices have a factor of 5 to 8 lower on-resistance per unit area, as compared to state-of-the-art DMOS or UMOS power devices fabricated by the most advanced processes available. In addition, GaAs VFETs have excellent switching speed, on the order of 1 to 2 ns. Therefore, with such a device, the efficiency of switching power supplies can be significantly improved.

SUMMARY OF THE INVENTION

It is herein recognized that a need exists for smaller, faster power devices. Specifically, it is desired to improve the on-resistance, junction capacitance, gate resistance and gate driving voltage; and provide a low-loss, high efficiency device. The present invention is directed toward meeting those needs.

Generally, and in one form of the invention, a method is presented for forming a vertical transistor device. The method comprises: forming a n-type source layer; forming a p+ carbon doped gate layer; forming a gate structure from the gate layer; and forming a n-type drain layer over the gate structure to provide a buried carbon doped gate structure. The buried carbon doped gate structure provides a very small device with favorable on-resistance, junction capacitance, gate resistance, and gate driving voltage. Preferably, the source layer is formed on a n+ substrate; a n+ cap layer is formed over the drain layer; the gate structure is formed by an ECR etch; and the source layer, the gate layer, and the drain layer are GaAs and are epitaxially formed.

In another form of the invention, a vertical transistor device is presented, comprising a n-type source layer; one or more p+ carbon doped gate structures; and a n-type drain layer. Preferably, the source layer is formed on a n+ substrate; a n+ cap layer is formed over the drain layer; and the source layer, the gate layer, and the drain layer are GaAs.

In yet another form of the invention a method of forming a vertical transistor device is presented, comprising the steps of forming a n-type source layer over a n+ substrate; forming a p+ carbon doped gate layer; forming a gate structure from the gate layer; forming a n-type drain layer over the gate structure; forming a n+ cap layer over the drain layer; implanting a p+ dopant to contact the gate structure; forming p-ohmic contact to the gate structure; forming n-ohmic drain contact; and forming n-ohmic source contact. Preferably, the implanted p+ dopant is Be or Zn; the p-ohmic contact is AuZn; the n-ohmic contact is PdGeIn; and the source layer, the gate layer, and the drain layer are GaAs.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Previous demonstrations of GaAs power VFETs, other than permeable base transistors that usually have too low a breakdown voltage for power applications, used two different structures. The first approach was a buried-gate structure, which employed beryllium implantation for the gate electrode, followed by an epitaxial overgrowth for the source terminals of the device. In the second approach, all the epitaxial layers for the device were grown first. Subsequently, conduction channels were defined by mesa etch, then Schottky metal gate electrodes were evaporated on both side of the channels. Although both approaches were used successfully to fabricate GaAs VFETs with a gate pitch in the 4- to 8-$\mu$m range, it was not possible to scale down the pitch below 4 $\mu$m, because of the lateral diffusion problem of p-type dopants, such as Zn, Be, and Mg, in the buried-gate structure and lithographic difficulties in the mesa/Schottky gate structure. The resultant devices were suitable for high voltage operation but not for low voltage, high current applications, such as a high efficiency rectifier. Consequently, the full potential of GaAs VFETs was never realized.

The use of carbon as a low diffusion, high concentration p-type dopant dramatically broadens the potential uses of GaAs Power VFETs. Specifically, buried carbon gate electrodes may be used to design VFETs with channel openings less than 1.0 $\mu$m. Meanwhile, the high doping concentration ($\approx 10^{20}$ cm$^{-3}$) can make the gate sheet resistance acceptable for converter type (<1 MHz switching) rectifier applications. In comparison to the most advanced UMOS power transistors reported currently, the GaAs VFET of the present invention is superior in the four categories that are important to the design of a low-loss, high-efficiency switching power supply: on-resistance, junction capacitance, gate resistance, and gate driving voltage. Furthermore, the new GaAs VFETs can be switched in less than 2 ns, while the UMOS power devices generally require at least 50 ns to switch because of much higher gate resistance.

The GaAs VFETs fabricated by the process of the present invention will not only be superior for high-frequency switching power supplies, but also for other applications such as high-power microwave amplifiers and high-gain photodetectors.

Figure 1A:
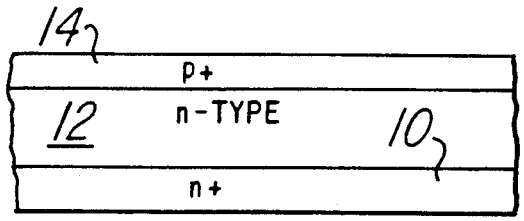
FIG. 1a–1e are cross-sectional views, at different processing stages, of a preferred embodiment of this invention.
Figure 1B:
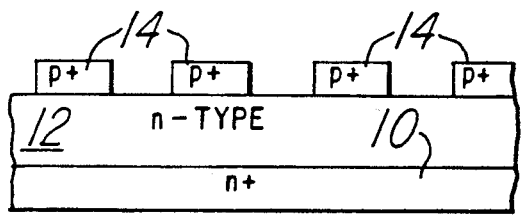

FIGS. 1a–1e show sequential steps of a preferred embodiment process to fabricate the device of the present invention. Table 1 below may be referred to for clarification of the element numbers in the drawings. As shown in FIG. 1a, a n-type epitaxial source layer 12 is formed over a preferably n+ substrate 10. The thickness and dopant level of the source layer 12 is dependent on the specific device design. However, the dopant level is generally considered n to n−. A p+ epitaxial gate layer 14 is then formed over the source layer 12. The gate layer 14 is preferably heavily doped, with carbon, at a concentration of preferably $\approx 10^{20}$ cm$^{-3}$ or higher, but may be doped at a lower concentration such as $10^{18}$ cm$^{-3}$. Generally, the higher the dopant concentration the faster the switching and the lower the gate resistance. The gate layer 14 is preferably $\approx 250$ nm thick or thicker to reduce gate resistance. The gate layer 14 is then etched to define the gate structures 14 shown in FIG. 1b. Due to the near zero impurity diffusion of carbon, the gate electrodes 14 may preferably be $\approx 1$ μm pitch. The resultant device will have a low-resistive, buried-gate structure with a channel opening of only 0.5 μm. Preferred lithography methods for this step are e-beam direct slice writing and a substantially damage free electron cyclotron resonance (ECR) etch to define the fine gate structure 14. Alternately, Stepper I-line lithography could be used. An RIE process could potentially be used to etch the gate/channels.

Figure 1C:
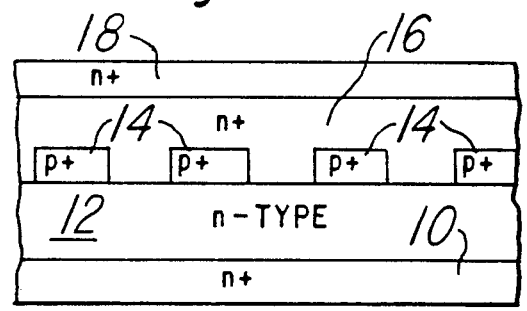
Figure 1D:
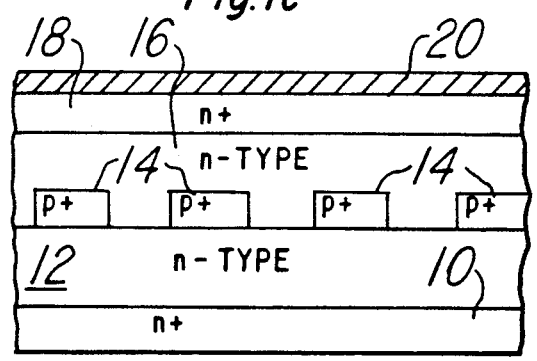
Figure 1E:
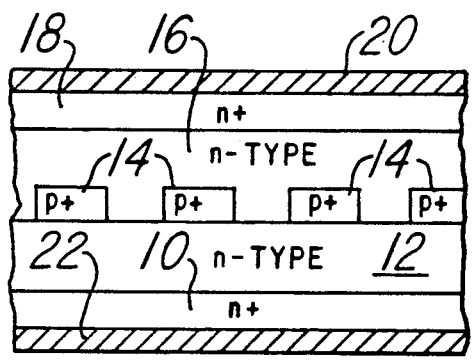

In FIG. 1c, a n-type epitaxial drain layer 16 is formed over the gate structures 14. The dopant concentration and thickness of the drain layer 16, like the source layer 12, is dependent on the specific device application. A n+ cap layer 18 may optionally be formed over the drain layer 16 to improve ohmic contact. A n++InGaAs layer may also be added for improved contact resistance. As shown in FIG. 1d, metal contact 20 to the drain 16 may be formed of, for example, non-alloyed PdGeIn. Other examples of contact material include AuGeN, PdGe, InGaAs with TiPtAu or WSi. The substrate 10 may then be thinned and metal contact 22 to the source 12 may be formed on the backside of the wafer. Please note, as is the case with FETs, the choice of source 12 and drain 16 designations are arbitrary and may be switched if desired.

The completed VFETs of the present invention show a gate sheet resistance of approximately only 30 ohms per square, almost two orders of magnitude lower than the gate electrodes of GaAs VFETs fabricated previously by other methods.

Figure 2A:
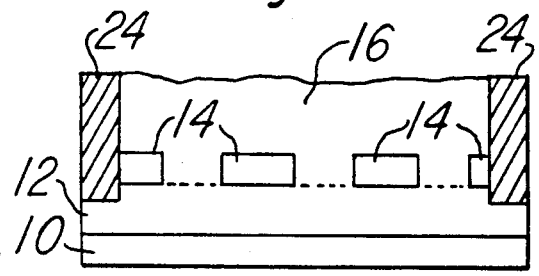
FIG. 2a–2c are cross-sectional views, at different processing stages, of a preferred embodiment method of forming contacts to this invention.
Figure 2B:
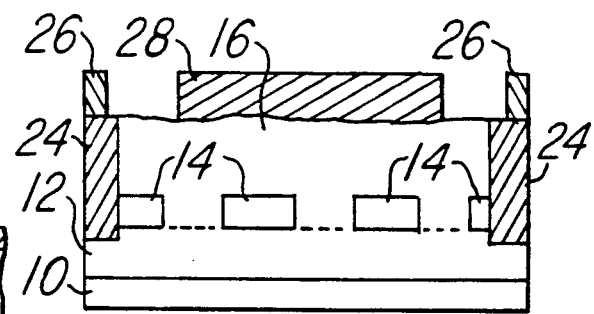
Figure 2C:
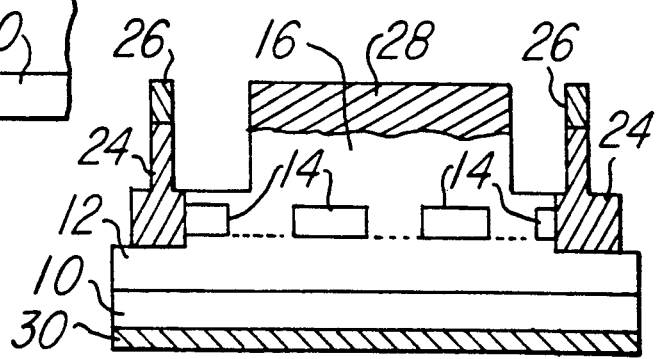

In FIGS. 2a–2c a preferred embodiment method for forming contacts to the gates 14, the drain 16, and the source 12 of the device of the present invention. Initially, the source layer 12 is formed, the gate layer 14 is formed and etched, and the drain layer 16 is formed in the manner described above and shown in FIGS. 1a–1c. A p+ implant 24, as shown in FIG. 2a, is preferably performed to contact the gates 14. The p+ implant 24 is preferably Be, but may alternately be a dopant such as Zn or Mg. The implant 24 provides a surface which remains essentially planar and results in a low gate resistance. However, if desired, a mesa etch process could be used to contact the gates 14.

N-ohmic contact 28 to the drain 16 and p-ohmic contact 26 to the gates 14 are shown in FIG. 2a. The n-ohmic contact 28 may preferably be PdGeIn, or alternately AuGeNi, PdGe, InGaAs with TiPtAu, or WSi. The p-ohmic contact 26 may preferably be AuZn, or alternately TiPtAu to a Zn diffused region. Shown in FIG. 2c are the preferred steps of ohmic cap etch isolation, mesa device isolation, and backside drain n-ohmic contact 30, therefore resulting in the desired electrical contact to the device.

A preferred embodiment has been described in detail hereinabove. It is to be understood that the scope of the invention also comprehends embodiments different from those described, yet within the scope of the claims. For example, the n type dopant, while preferably silicon, could be a material such as S, or Se. Similarly, the GaAs could be replaced with a material such as InGaAs, InP, or GaInP. Alternately, a combination of GaAs as the source and gate layers with alternative drain materials such as InGaAs, InP, or GaInP could be used. Words of inclusion are to be interpreted as nonexhaustive in considering the scope of the invention.

While this invention has been described with reference to illustrative embodiments, this description is not intended to be constructed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| ELEMENT NO. | DESCRIPTION |
| --- | --- |
| 10 | SUBSTRATE |
| 12 | SOURCE LAYER |
| 14 | GATE LAYER/STRUCTURES |
| 16 | DRAIN LAYER |
| 18 | CAP LAYER |
| 20 | METAL CONTACT TO SOURCE |
| 22 | METAL CONTACT TO DRAIN |
| 24 | P+ IMPLANT |
| 26 | GATE P-OHMIC CONTACT |
| 28 | DRAIN N-OHMIC CONTACT |
| 30 | SOURCE N-OHMIC CONTACT |

What is claimed is:

1. A method of forming a vertical transistor device comprising:
   a. forming an n-type source layer;
   b. forming a p+ carbon doped gate layer over said source layer;
   c. forming a gate structure from said gate layer; and
   d. forming a n-type drain layer over said gate structure.

2. The method of claim 1, wherein said source layer is formed on a substrate.

3. The method of claim 2, wherein said substrate has n+ doping.

4. The method of claim 1, wherein a cap layer is formed over said drain layer.

5. The method of claim 4, wherein said cap layer has n+ doping.

6. The method of claim 1, wherein said source layer, said gate layer, and said drain layer are GaAs.

7. The method of claim 1, wherein said source layer, said gate layer, and said drain layer are epitaxially formed.

8. The method of claim 1, wherein said gate structure is formed by an ECR etch.

9. A method of forming a vertical transistor device comprising:
   a. forming an n-type source layer over a n+ substrate;

b. forming a p+ carbon doped gate layer over said source layer;
c. forming a gate structure from said gate layer;
d. forming a n-type drain layer over said gate structure;
e. forming a n+ cap layer over said drain layer;
f. implanting a p+ dopant to contact said gate structure;
g. forming a p-ohmic contact to said gate structure;
h. forming an n-ohmic source contact; and
i. forming an n-ohmic drain contact.

10. The method of claim 9, wherein said implanted p+ dopant is Be.
11. The method of claim 9, wherein said implanted p+ dopant is Zn.
12. The method of claim 9, wherein said p-ohmic contact is AuZn.
13. The method of claim 9, wherein said n-ohmic contact is PdGeIn.
14. The method of claim 9, wherein said drain layer, said gate layer, and said source layer are GaAs.

* * * * *

UNITED STATES PATENT AND TRADEMARK OFFICE
CERTIFICATE OF CORRECTION

PATENT NO. : 5,231,037
DATED : 07/27/93
INVENTOR(S) : Yuan et al.

It is certified that error appears in the above-identified patent and that said Letters Patent is hereby corrected as shown below:

On title page, item [75] Inventors: insert
--Donald L. Plumton, of Dallas, Texas--.

Signed and Sealed this

Twelfth Day of April, 1994

Attest:

BRUCE LEHMAN

Attesting Officer

Commissioner of Patents and Trademarks